(12) United States Patent
Sundararajan (10) Patent No.: US 7,852,107 B1
(45) Date of Patent: Dec. 14, 2010

(54) SINGLE EVENT UPSET MITIGATION

(75) Inventor: Prasanna Sundararajan, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 12/707,935

(22) Filed: Feb. 18, 2010

(51) Int. Cl.
*H03K 19/003* (2006.01)
*H03K 19/007* (2006.01)
*G01R 31/28* (2006.01)

(52) U.S. Cl. .............................. 326/10; 326/40; 326/46; 714/725

(58) Field of Classification Search .................... 326/10, 326/38–41, 47; 714/48, 725
See application file for complete search history.

(56) References Cited

U.S. PATENT DOCUMENTS

| | | | |
|---|---|---|---|
| 6,526,559 B2 * | 2/2003 | Schiefele et al. | 716/16 |
| 6,624,654 B1 | 9/2003 | Trimberger | |
| 7,036,059 B1 * | 4/2006 | Carmichael et al. | 714/725 |
| 7,212,448 B1 * | 5/2007 | Trimberger | 365/189.02 |
| 7,406,673 B1 | 7/2008 | Patterson et al. | |

OTHER PUBLICATIONS

U.S. Appl. No. 12/274,261, filed Nov. 19, 2008, Lesea.

Brinkley, Phil et al., *SEU Mitigation Design Techniques for the XQR4000XL*, XAPP181 (v1.0), Mar. 15, 2000, pp. 1-14, Xilinx, Inc., San Jose, California, USA.

Gusmao De Lima Kastensmidt, Fernanda et al., Designing Fault Tolerant Techniques for SRAM-Based FPGAs, *IEEE Design & Test of Computers*, Nov. 2004, pp. 552-562, vol. 21, Issue 6, IEEE Computer Society Press, Los Alamitos, California, USA.

Lima, Fernanda et al., "Designing Fault Tolerant Systems into SRAM-based FPGAs," *Proc. of the 40th Design Automation Conference (DAC'03)*, Jun. 2, 2003, pp. 650-655, ACM, New York, New York, USA.

* cited by examiner

*Primary Examiner*—Daniel D Chang
(74) *Attorney, Agent, or Firm*—LeRoy D. Maunu (57) ABSTRACT

In one embodiment of the invention, a method is provided for protecting against single event upsets of a circuit in programmable logic. Configuration memory cells of the programmable logic are configured to implement first and second copies of the circuit. In response to detecting a single event upset of one of the configuration memory cells, an address of the one of the configuration memory cells is determined. The one of the first and second copies of the circuit in which the single event upset occurred is determined from the address of the one of the configuration memory cells. The output from the one of the first and second copies of the circuit in which the single event upset did not occur is selected as an output of the circuit.

20 Claims, 7 Drawing Sheets

SINGLE EVENT UPSET MITIGATION

FIELD OF THE INVENTION

The present invention generally relates to the detection and correction of single event upsets such as those induced in programmable integrated circuits.

BACKGROUND

Programmable Integrated Circuits (ICs) are ICs that are user configurable and capable of implementing digital logic operations. There are several types of programmable ICs, including field programmable gate arrays (FPGAs) and complex programmable logic devices (CPLDs). CPLDs typically include several function blocks that are based on the well-known programmable logic array (PLA) architecture with sum-of-products logic, and include a central interconnect matrix to transmit signals between the function blocks. Signals are transmitted into and out of the interconnect matrix through input/output blocks (IOBs).

The input/output function of the IOBs, the logic performed by the function blocks and the signal paths implemented by the interconnect matrix are all controlled by configuration data stored in configuration memory of the CPLD. FPGAs include configurable logic blocks (CLBs) arranged in rows and columns, IOBs surrounding the CLBs, and programmable interconnect lines that extend between the rows and columns of CLBs. Each CLB includes look-up tables and other configurable circuitry that are programmable to implement a portion of a larger logic function. The CLBs, IOBs and interconnect lines are configured by data stored in a configuration memory of the FPGA.

The reprogrammability of many programmable ICs makes them advantageous in many applications because it is possible to update (reconfigure) programmable logic by loading new configuration data, as compared to application-specific integrated circuits (ASICs), which would require replacement. The versatility of reprogrammable ICs is advantageous in applications such as aerospace where remote reconfiguration is preferred over physical replacement. However, many aerospace applications expose components to environments where radiation is present, which can cause single event upsets (SEUs) in configuration memory cells and result in the configured logic not operating as intended. In some instances, an SEU may have only a transient effect and may disappear.

Previous techniques to mitigate the affect of SEUs involve the use of triple modular redundancy (TMR). In these techniques three redundant copies of selected logic are implemented and operate in parallel. The output of each copy is analyzed by a majority voter to determine the correct value of the output. In addition to TMR, scrubbing may be employed to reconfigure the memory cells of the integrated circuit when an SEU is detected. However, triple modular redundancy is expensive as the circuit needs to be triplicated, which requires three times the circuit area of the single circuit.

The present invention may address one or more of the above issues.

SUMMARY

In one embodiment of the invention, a method is provided for protecting against single event upsets of a circuit in programmable logic. Configuration memory cells of the programmable logic are configured to implement first and second copies of the circuit. In response to detecting a single event upset of one of the configuration memory cells, an address of the one of the configuration memory cells is determined. The one of the first and second copies of the circuit in which the single event upset occurred is determined from the address of the one of the configuration memory cells. The output from the one of the first and second copies of the circuit in which the single event upset did not occur is selected as an output of the circuit.

In another embodiment of the invention, a system is provided for handling single event upsets in programmable logic. The system includes a plurality of programmable logic resources, a plurality of programmable routing resources for coupling the programmable logic resources, and a plurality of configuration memory cells coupled to the programmable logic resources and to the programmable routing resources. A first copy of a redundant circuit is implemented on a first subset of the programmable logic resources and programmable routing resources using a first subset of the configuration memory cells. A second copy of the redundant circuit is implemented on a second subset of the programmable logic resources and programmable routing resources using a second subset of the configuration memory cells. A single event upset (SEU) detector for detecting upsets of the configuration memory cells is coupled to the configuration memory cells. In response to detecting an upset of a configuration memory cell, the SEU detector outputs an address of the upset configuration memory cell. The system includes a discernment circuit coupled to the SEU detector and configured to determine, from the address of the upset configuration memory cell, which one of the first and second copies of the redundant circuit contains the upset configuration memory cell. The discernment circuit provides a selection signal indicative of the copy of the redundant circuit that does not contain the upset configuration memory cell. The system also includes a selection circuit coupled to the discernment circuit. The selection circuit selects output from the one of the first and second copies of the redundant circuit that does not contain the upset configuration memory cell in response to the selection signal.

In yet another embodiment of the invention, an article of manufacture is provided. The article of manufacture is characterized by a processor-readable storage medium configured with processor-executable instructions. When executed by a processor the instructions cause the processor to program configuration memory cells of the programmable logic to implement first and second copies of the circuit. The instructions also cause the processor, in response to detecting a single event upset of one of the configuration memory cells, to determine an address of the one of the configuration memory cells. The instructions configure the processor to determine, from the address of the one of the configuration memory cells, in which of the first and second copies of the circuit the single event upset occurred. The configured processor selects output from the one of the first and second copies of the circuit in which the single event upset did not occur.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which.

DETAILED DESCRIPTION

Single event upsets (SEUs) may cause configuration memory cells of programmable logic to change states, resulting in reconfigured logic that produces incorrect output. Previous techniques to mitigate the effect of SEUs require the implementation of at least three redundant copies of a circuit to determine the correct output through majority voting. Embodiments of the present invention provide a method and system for efficient mitigation of single event upsets (SEUs) in an integrated circuit using double modular redundancy (DMR).

With DMR, two copies of a circuit are implemented, and the outputs from the two copies are compared. Because only two redundant copies are required to be implemented for double modular redundancy, SEU mitigation is achieved at a low hardware cost compared to that required for TMR. If the outputs differ, then an SEU is present and the various embodiments of the present invention determine which of the redundant circuits was struck by the SEU. The output from the circuit that did not experience the SEU is selected. The embodiments of the invention determine which copy of the redundant circuit was corrupted by an SEU, allowing for continuous operation without the need to reset both redundant modules. In DMR approaches described herein, the continuous operation provided by TMR following an SEU can be achieved without incurring the full cost of TMR hardware.

Figure 1:
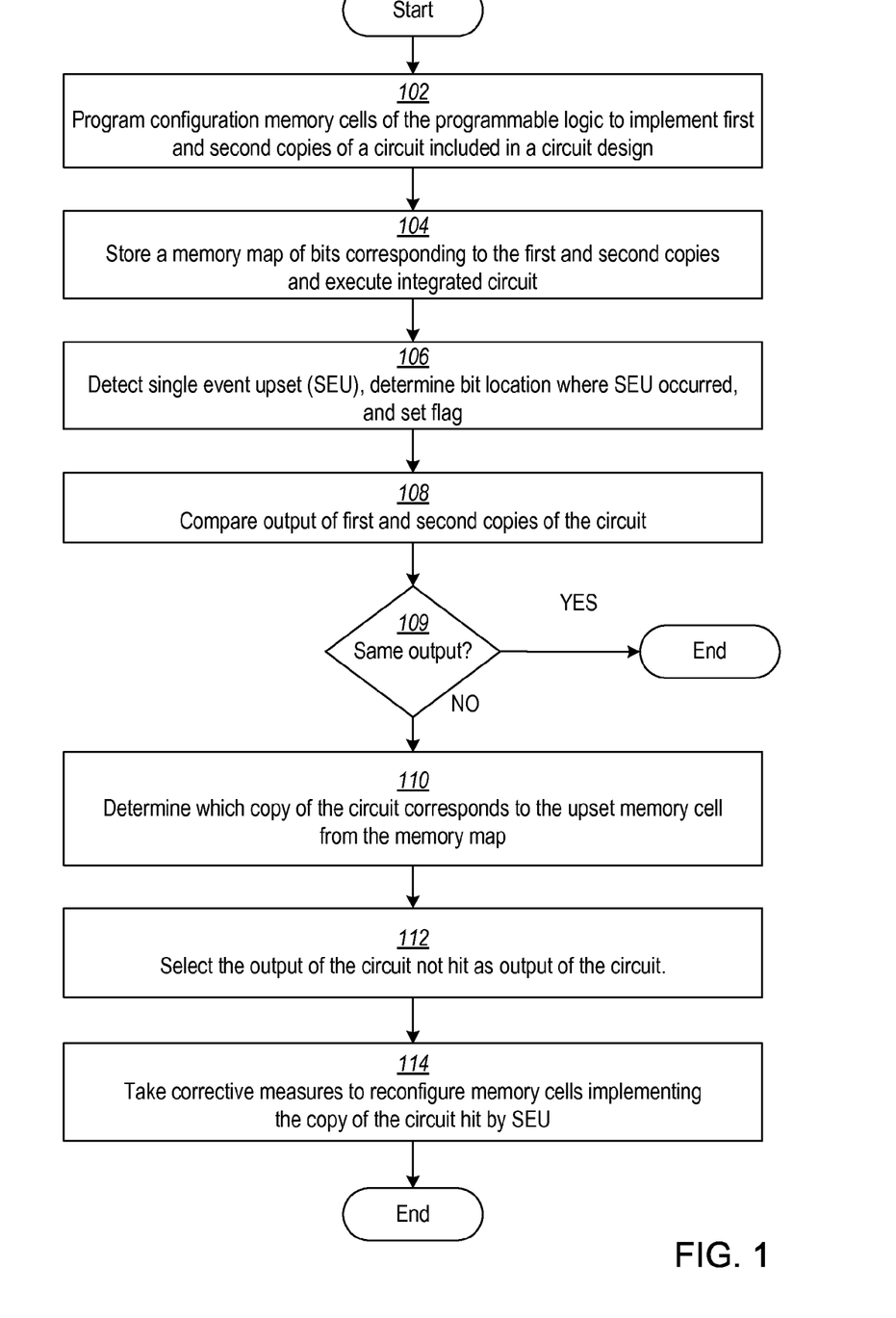
FIG. 1 illustrates a flow diagram of a process of detecting, correcting, and mitigating effects of single event upsets in programmable logic in accordance with several embodiments of the invention.

FIG. 1 illustrates a flow diagram of a process of mitigating, detecting, and correcting single event upsets in programmable logic in accordance with several embodiments of the invention. Configuration memory cells of the programmable logic are configured to implement a first and a second copy of a circuit design at step 102. The programmable logic is then configured to store a memory map, which indicates bits of configuration memory corresponding to the first copy and those corresponding to the second copy, and the configured programmable logic is engaged to operate at step 104. In various implementations the memory map may be stored in volatile or non-volatile memory. If stored in volatile memory that is susceptible to SEUs, mitigation techniques may be employed to keep the memory map data immune from SEU effects. The memory map may also be stored either in internal memory of the programmable logic or external memory that is accessible by the programmable logic.

If an SEU detector detects a single event upset, the SEU detector determines the address of configuration memory corresponding to the memory cell in which the SEU occurred at step 106. The outputs of the first and second circuit copies are compared at step 108. If a discrepancy exists in the compared outputs, the process determines which copy of the circuit corresponds to the upset configuration memory cell at step 110. The bit affected by an SEU will not necessarily affect the functionality of the logic used by the first or second circuit copies. By ignoring the SEU unless output is affected, processing needed for reconfiguration and determination of the module in which the SEU event occurred is avoided. In this example, if the compared outputs are the same, the SEU is ignored as shown by decision step 109.

In some implementations, the outputs are not compared at step 109. Rather, whenever an SEU is detected, the process determines which copy of the circuit corresponds to the upset configuration memory cell at step 110. The output of the non-faulty copy of the circuit is selected at step 112. In one embodiment, corrective measures are taken to reconfigure configuration memory cells that implement the copy of the circuit hit by SEU at step 114.

Figure 2:
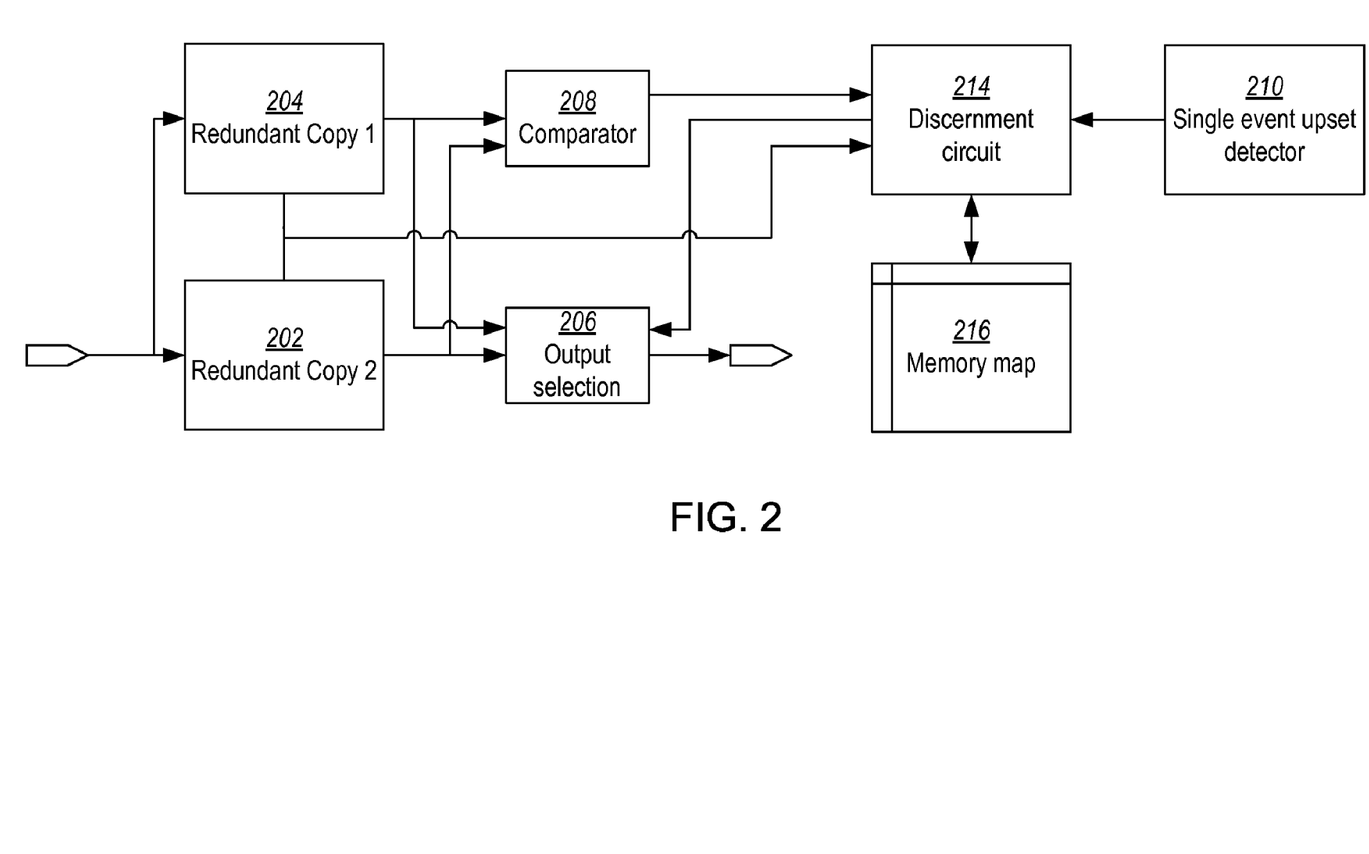
FIG. 2 illustrates a block diagram of an example circuit for detecting and responding to single event upsets in programmable logic in accordance with several embodiments of the invention.

FIG. 2 illustrates a block diagram of an example circuit for detecting and responding to single event upsets in programmable logic in accordance with several embodiments of the invention. In this example, two redundant copies 202 and 204 of a circuit are implemented in programmable logic using one or more programmable logic blocks for each copy of the circuit. The two redundant copies are coupled to a comparator circuit 208 and an output selection circuit 206 to select between the output generated by the two copies. When an SEU occurs, it is detected by the SEU detector 210. The SEU detector determines the address in the configuration memory cells of the programmable logic where the SEU event occurred. This address is passed to the discernment circuit 214. The comparator circuit 208 compares the outputs of the two redundant circuits 202 and 204. If a discrepancy exists in the compared outputs, the discernment circuit 214 accesses memory map 216 to determine which of the redundant circuits 202 or 204 the SEU struck. The discernment circuit 214 directs output selection circuit 206 to select output from the one of redundant circuits 202 or 204 that does not contain the upset memory cell.

The SEUs may be detected by the SEU detector 210 in a number of ways. In one implementation, an SEU can be detected by continuously scanning the configuration cells of the device and computing a checksum. If the computed checksum of a scan differs from the previous checksum an SEU is detected. Hardware to perform scanning and detection is included in Xilinx Virtex-5 devices. Virtex-5 also includes hardware to determine the address of the programmable logic block in which the SEU occurred. An error correcting code (ECC) value is embedded in each frame of configuration memory. As each frame is scanned, the built-in ECC logic calculates the ECC value for the current content, which combines with the embedded EEC to expose any error. It is then possible to use this EEC to identify the address of a single bit error in the frame which has been read. If an SEU is detected, an SEU flag is set and the configuration memory address is sent to the discernment circuit.

Since the SEU detector scans the entire configuration memory, the timing of the discrepancy between outputs of the redundant circuits may not coincide with the SEU detector's scan of the configuration memory address space occupied by the redundant circuits. If a discrepancy exists between the outputs of the two redundant circuits 202 and 204, the discernment circuit 214 checks to determine if an SEU has occurred. In response to an indication of a discrepancy, discernment circuit 214 first checks to see if SEU detector 210 has detected an SEU that coincides with the configuration memory address space occupied by the redundant circuits as described by the memory map 214. If an SEU has not been detected in that configuration memory address space, discernment circuit 214 signals SEU detector 210 to scan a range of the configuration memory that configures the redundant circuits.

If an SEU is detected in the specified range, the discernment circuit 214 determines which of the circuit copies 202 or 204 corresponds to the address indicated by the SEU detector 210 and directs output selection circuit 206 to select output from the one of circuit copies 202 or 204 not affected by SEU.

Figure 3:
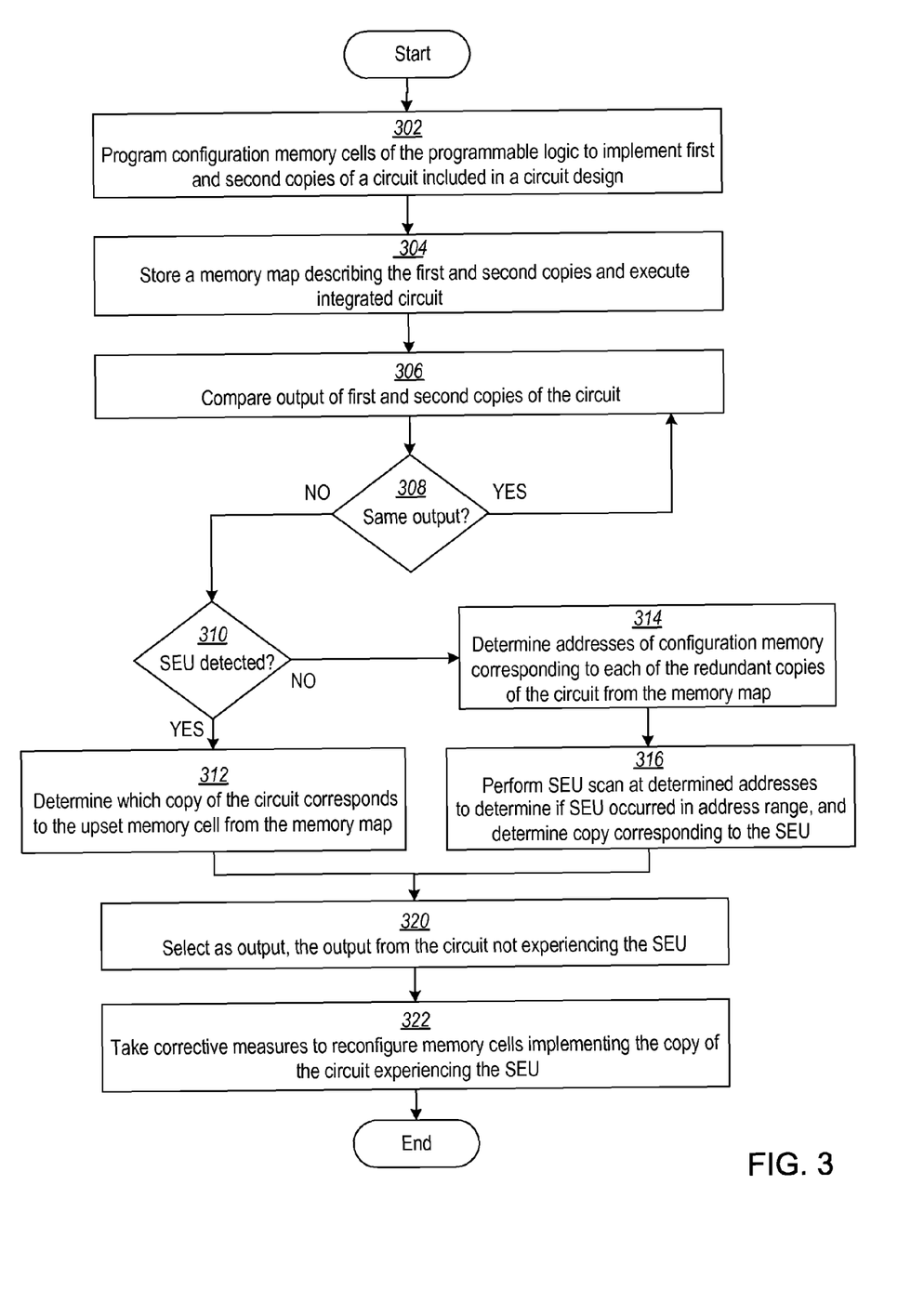
FIG. 3 illustrates a flow diagram of a process of mitigating and correcting effects of single event upsets in programmable logic in response to detecting a discrepancy in the output of redundant circuits.

FIG. 3 illustrates a flow diagram of a process of mitigating single event upsets in programmable logic in response to detecting a discrepancy in the output of redundant circuits. Configuration memory cells of the programmable logic are configured to implement a first and a second copy of a circuit design at step 302. The programmable logic is configured to store a memory map, which indicates bits of configuration memory corresponding to the first copy and those corresponding to the second copy, and the configured programmable logic is engaged to operate at step 304.

The outputs of the first and second circuit copies are compared at step 306. If a discrepancy is detected in the compared output at decision step 308 and an SEU has been detected at step 310, the process determines from the memory map, which copy of the circuit corresponds to the upset configuration memory cell at step 312.

If an SEU has not been detected at decision step 310, the process determines the addresses of configuration memory cells corresponding to the first and second circuit copies from the memory map at step 314. An SEU scan at the determined addresses is performed to determine if an SEU occurred within the address range at step 316. Also at step 316, the circuit copy corresponding to the SEU is determined from the addresses retrieved from the memory map.

The output of the copy determined not to have experienced an SEU is selected at step 320. Corrective measures are taken to reconfigure the faulty configuration memory cell at step 322.

Various approaches may be employed to generate the memory map that indicates which configuration memory cells implement each of the first and second copies of the circuit design. For example, U.S. Pat. No. 7,406,673, which is incorporated herein by reference, describes generating a bitstream view of a design, which provides a correlation of a physical circuit description (e.g., essential configuration bits) and a logical circuit description (e.g., one or more of the logic elements that make up the circuit design).

Figure 4:
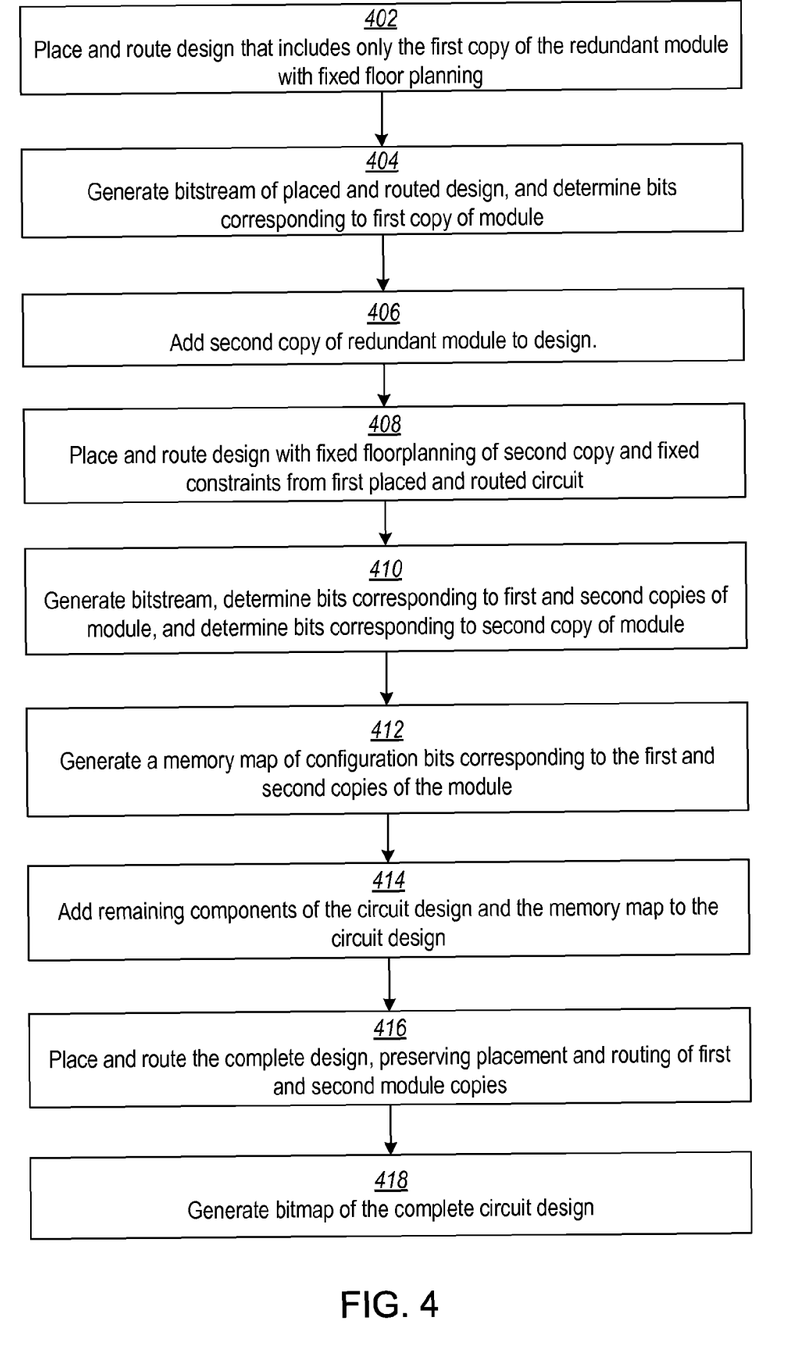
FIG. 4 illustrates a flowchart of an example process for building a memory map for a circuit design having redundant copies of a circuit in accordance with various embodiments of the invention.

FIG. 4 illustrates a flowchart of an example process for building a memory map for a circuit design having redundant copies of a circuit in accordance with various embodiments of the invention. A design containing only the first circuit copy is placed and routed at step 402. The module has fixed floor planning that specifies placement and routing of the first circuit copy at particular locations on a target programmable IC, which has known corresponding configuration memory cells. A bitstream of the placed and routed design is generated, and the bits corresponding to first circuit copy are determined at step 404.

A second circuit copy is added to the design at step 406. The design containing both the first and second copies is placed and routed at step 408. During place and route, fixed floor planning of the second copy is used to lock down placement and routing associated with the second circuit copy and to preserve placement and routing of the first copy from step 402. A bitstream of the design is generated at step 410, and the bits corresponding to first and second copies are determined. With knowledge of those bits corresponding to the combination of both the first and second copies, and with knowledge of bits corresponding to only the first circuit copy as obtained in step 404, the bits corresponding to the second circuit copy are determined. At step 412, a memory map of bits in configuration memory corresponding to each of the first and second circuit copies is created. Remaining components of the complete circuit design and the memory map are added to the design at step 414. Floor planning constraints for the first and second circuit copies are maintained, and the complete design, including the memory map, is placed and routed at step 416. The placement and routing of the first and second copies of the redundant module are preserved in placing and routing the complete design. A configuration bitmap of the complete design is generated at step 418.

The process shown in FIG. 4 may be used to generate a bitmap of a circuit design implementing DMR for several modules of a circuit, in which case steps 402-412 are repeated for each redundant module pair to generate memory map of bits for each of the redundant set. All redundant copies can be added along with the remaining components of the circuit design at step 414.

Figure 5:
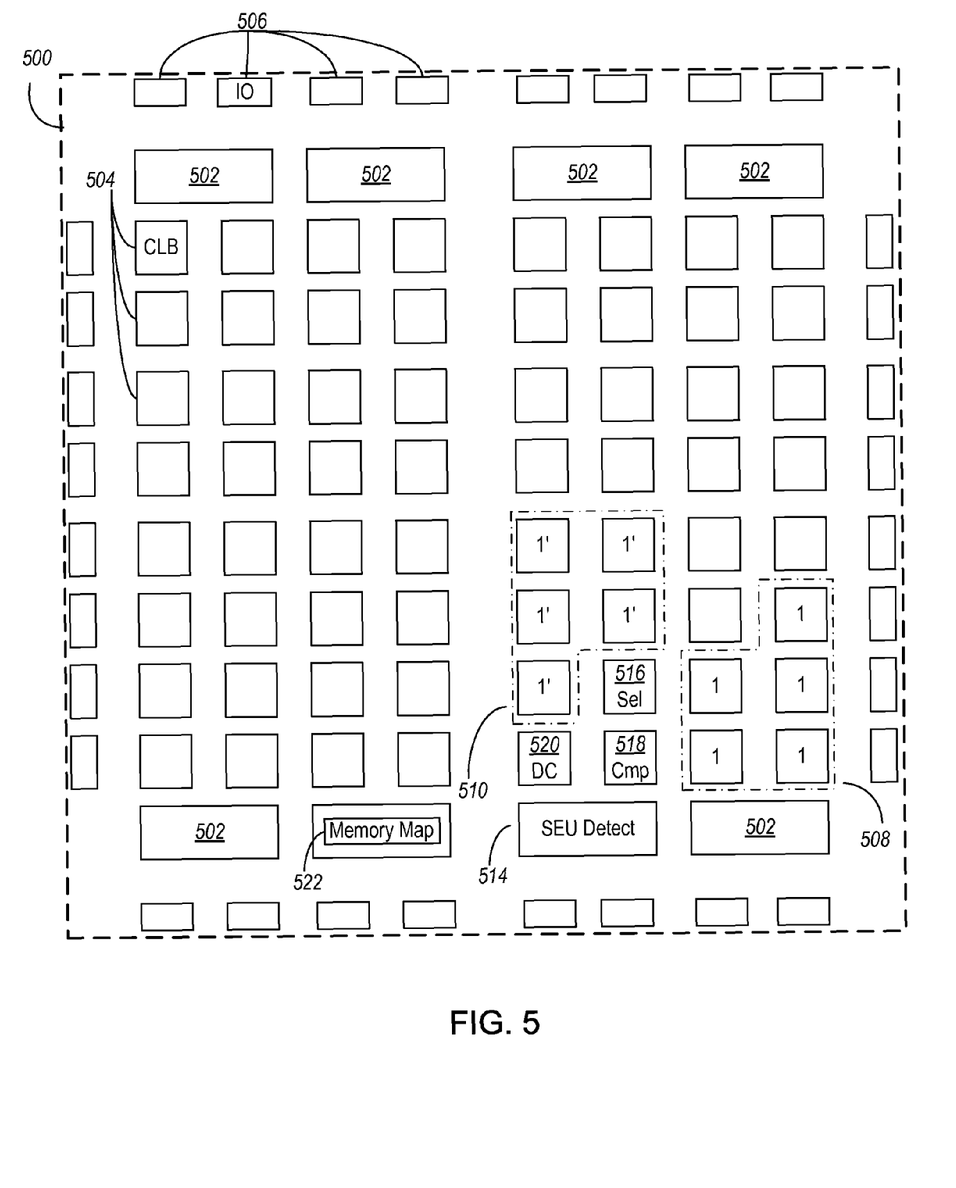
FIG. 5 illustrates, a block diagram of a typical field programmable gate array (FPGA) configured for SEU mitigation in accordance with several embodiments of the invention.

FIG. 5 illustrates, a block diagram of a typical field programmable gate array (FPGA) configured for SEU mitigation in accordance with several embodiments of the invention. An FPGA may include memory units 502 for storage, configurable logic blocks (CLBs) 504, and input/output blocks (IO) 506 to communicate with other devices.

FPGA 500 is configured to implement two redundant copies 508 and 510 of a circuit. Each of the two redundant copies is implemented with several CLBs. The SEU mitigation circuitry of the present invention may be realized with either hard or soft implementation. Hard implementation refers to the use of non-programmable hardware, and soft refers to implementation using one or more CLBs. For ease of illustration, output selection circuit 516, output comparator circuit 518, and discernment circuit 520 are each implemented on respective CLBs. SEU detector circuit 514 is implemented with dedicated hardware or processor for performing SEU detection. In some embodiments, SEU detector circuit 514 may be implemented using programmable logic. Likewise, output selection circuit 516, comparator circuit 518, and/or discernment circuit 520 may be implemented using dedicated hardware, or a processor.

SEU detector circuit 514 is configured to detect SEUs and determine an address of the configuration memory cell in which the SEU occurred. Comparator circuit 518 is configured to compare the outputs generated by redundant copies 508 and 510 and signal discernment circuit 520 if a discrepancy is detected. If a discrepancy is detected, discernment circuit 520 determines in which redundant copy 508 or 510 the SEU occurred by looking up the module corresponding to the address of the faulty memory cell in a memory map 522 stored in one of the memory units 502. In embodiments where the memory map is stored in an external memory, discernment circuit 520 communicates with the external memory via an input/output interface 506.

Discernment circuit 520 sends a signal to output selection circuit 516 indicating in which module copy the SEU occurred. Selection circuit 516 selects and outputs the output generated by the corresponding module copy in which the SEU did not occur.

Figure 6:
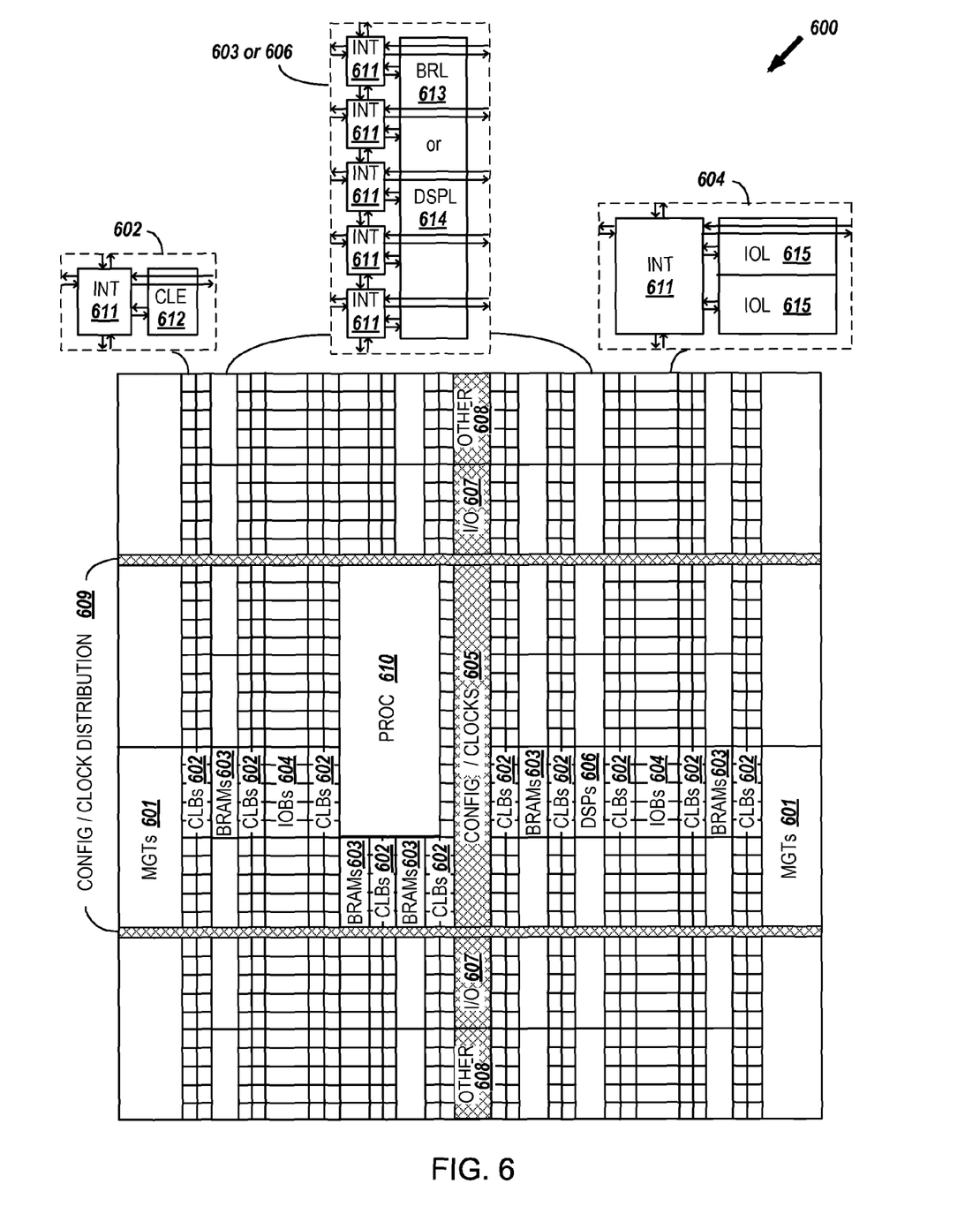
FIG. 6 is a block diagram of an example programmable integrated circuit that may be used in implementing SEU mitigation in accordance with various embodiments of the invention.

FIG. 6 is a block diagram of an example programmable integrated circuit that may be used in implementing SEU mitigation in accordance with various embodiments of the invention. SEU mitigation, as previously described, may be implemented on the programmable logic and interconnect resources of programmable integrated circuit.

FPGAs can include several different types of programmable logic blocks in the array. For example, FIG. 6 illustrates an FPGA architecture (600) that includes a large number of different programmable tiles including multi-gigabit transceivers (MGTs 601), configurable logic blocks (CLBs 602), random access memory blocks (BRAMs 603), input/output blocks (IOBs 604), configuration and clocking logic (CONFIG/CLOCKS 605), digital signal processing blocks (DSPs 606), specialized input/output blocks (I/O 607), for example, e.g., clock ports, and other programmable logic 608 such as digital clock managers, analog-to-digital converters, system monitoring logic, and so forth. Some FPGAs also include dedicated processor blocks (PROC 610).

In some FPGAs, each programmable tile includes a programmable interconnect element (INT 611) having standardized connections to and from a corresponding interconnect element in each adjacent tile. Therefore, the programmable interconnect elements taken together implement the programmable interconnect structure for the illustrated FPGA. The programmable interconnect element INT 611 also includes the connections to and from the programmable logic element within the same tile, as shown by the examples included at the top of FIG. 6.

For example, a CLB 602 can include a configurable logic element CLE 612 that can be programmed to implement user logic plus a single programmable interconnect element NT 611. A BRAM 603 can include a BRAM logic element (BRL 613) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 606 can include a DSP logic element (DSPL 614) in addition to an appropriate number of programmable interconnect elements. An 10B 604 can include, for example, two instances of an input/output logic element (IOL 615) in addition to one instance of the programmable interconnect element INT 611. As will be clear to those of skill in the art, the actual I/O pads connected, for example, to the I/O logic element 615 are manufactured using metal layered above the various illustrated logic blocks, and typically are not confined to the area of the input/output logic element 615.

In the pictured embodiment, a columnar area near the center of the die (shown shaded in FIG. 6) is used for configuration, clock, and other control logic. Horizontal areas 609 extending from this column are used to distribute the clocks and configuration signals across the breadth of the FPGA.

Some FPGAs utilizing the architecture illustrated in FIG. 6 include additional logic blocks that disrupt the regular columnar structure making up a large part of the FPGA. The additional logic blocks can be programmable blocks and/or dedicated logic. For example, the processor block PROC 610 shown in FIG. 6 spans several columns of CLBs and BRAMs.

Note that FIG. 6 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 6 are purely exemplary. For example, in an actual FPGA more than one adjacent column of CLBs is typically included wherever the CLBs appear, to facilitate the efficient implementation of user logic.

Those skilled in the art will appreciate that various alternative computing arrangements, including one or more processors and a memory arrangement configured with program code, would be suitable for hosting the processes and data structures of the different embodiments of the present invention.

Figure 7:
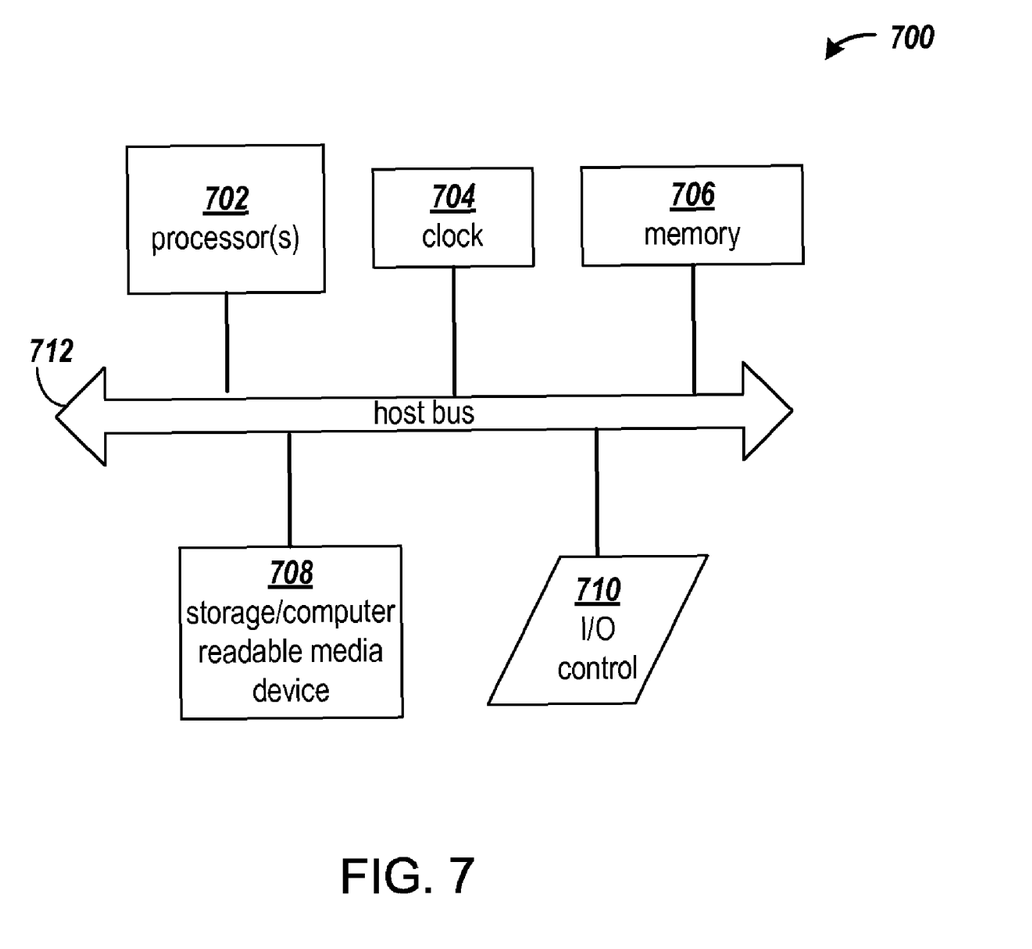
FIG. 7 is a block diagram of an example computing arrangement on which several processes of the present invention may be implemented.

FIG. 7 is a block diagram of an example computing arrangement on which the processes described herein may be implemented. Those skilled in the art will appreciate that various alternative computing arrangements, including one or more processors and a memory arrangement configured with program code, would be suitable for hosting the processes and data structures and implementing the algorithms of the different embodiments of the present invention. The computer code, comprising the processes of the present invention encoded in a processor executable format, may be stored and provided via a variety of computer-readable storage media or delivery channels such as magnetic or optical disks or tapes, electronic storage devices, or as application services over a network.

Processor computing arrangement 700 includes one or more processors 702, a clock signal generator 704, a memory unit 706, a storage unit 708, and an input/output control unit 710 coupled to host bus 712. The arrangement 700 may be implemented with separate components on a circuit board or may be implemented internally within an integrated circuit. When implemented internally within an integrated circuit, the processor computing arrangement is otherwise known as a microcontroller.

The architecture of the computing arrangement depends on implementation requirements, as would be recognized by those skilled in the art. The processor 702 may be one or more general purpose processors, or a combination of one or more general purpose processors and suitable co-processors, or one or more specialized processors (e.g., RISC, CISC, pipelined, etc.), for example.

The memory arrangement 706 typically includes multiple levels of cache memory, and a main memory. The storage arrangement 708 may include local and/or remote persistent storage such as provided by magnetic disks (not shown), flash, EPROM, or other non-volatile data storage. The storage unit may be read or read/write capable. Further, the memory 706 and storage 708 may be combined in a single arrangement.

The processor arrangement 702 executes the software in storage 708 and/or memory 706 arrangements, reads data from and stores data to the storage 708 and/or memory 706 arrangements, and communicates with external devices through the input/output control arrangement 710. These functions are synchronized by the clock signal generator 704. The resource of the computing arrangement may be managed by either an operating system (not shown), or a hardware control unit (not shown).

The present invention is thought to be applicable to a variety of systems and methods for handling single event upsets in programmable logic. For example, an FPGA or other Programmable Logic Device is used in the examples herein as the programmable logic used to implement the invention. However, the invention can also be applied to other types of programmable logic. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A method of protecting against single event upsets of a circuit in programmable logic, comprising:
   programming configuration memory cells of the programmable logic to implement first and second copies of the circuit; and
   in response to detecting a single event upset of one of the configuration memory cells,
      determining an address of the one of the configuration memory cells;
      determining in which of the first and second copies of the circuit the single event upset occurred from the address of the one of the configuration memory cells;
      selecting an output from the one of the first and second copies of the circuit in which the single event upset did not occur; and
      outputting the selected output.

2. The method as in claim 1, further comprising:
   comparing the output from the first and second copies of the circuit; and
   wherein the selecting of the output includes selecting output from the one of the first and second copies of the circuit in response to detecting a single event upset of one of the configuration memory cells and a discrepancy in the compared output.

3. The method as in claim 1, further comprising:
   comparing the output from the first and second copies of the circuit; and
   wherein the determining in which of the first and second copies of the circuit the single event upset occurred and the selecting of the output are performed in response to detecting a single event upset of one of the configuration memory cells and a discrepancy in the compared output.

4. The method as in claim 1, further comprising:
   storing a memory map indicating addresses of the configuration memory cells that program the first copy of the circuit and addresses of the configuration memory cells that program the second copy of the circuit.

5. The method as in claim 4, wherein determining in which of the first and second copies of the circuit the single event upset occurred includes looking up the address of the one of the configuration memory cells in the memory map and determining the one of the first and second copies of the circuit indicated by the address.

6. The method as in claim 4, further comprising:
   in response to a single event upset, reconfiguring one or more bits implementing the copy of the circuit in which the single event upset occurred.

7. The method as in claim 4, further comprising:
   associating respective identifiers of each copy of the circuit with addresses of configuration memory cells during generation of a bitstream used to program the programmable logic; and
   storing the addresses of the configuration memory cells and associated identifiers in the memory map.

8. The method as in claim 4, wherein the memory map is stored in a non-volatile memory.

9. The method as in claim 2, further comprising:
   detecting the single event upset by polling the configuration memory cells and comparing values of the configuration memory cells with a stored copy of the values of the configuration memory cells.

10. The method as in claim 4, wherein the memory map is generated during design placement and routing of a circuit design of the circuit.

11. The method as in claim 1, further comprising:
    comparing the output of the first and second copies of the circuit; and
    in response to a discrepancy in the compared output, determining whether or not a single event upset occurred.

12. The method of claim 11, wherein the determining whether or not a single event upset occurred includes:
    determining memory addresses of the configuration memory that implement the first and second copies of the circuit; and
    determining whether or not values stored in the configuration memory cells at the determined memory addresses are correct.

13. The method of claim 12, wherein the determining of the memory addresses includes retrieving configuration memory address of the first and second copies of the circuit from a memory map.

14. The method of claim 12, wherein the determining whether or not the values of the configuration memory cells at the determined memory addresses are correct includes:
    calculating a checksum for the values stored in the configuration memory cells; and
    comparing the calculated checksum to an expected checksum.

15. A system for handling single event upsets in programmable logic, comprising:
    a plurality of programmable logic resources;
    a plurality of programmable routing resources for coupling the programmable logic resources;
    a plurality of configuration memory cells coupled to the programmable logic resources and to the programmable routing resources;
    a first copy of a redundant circuit implemented on a first subset of the programmable logic resources and programmable routing resources using a first subset of the configuration memory cells;
    a second copy of the redundant circuit implemented on a second subset of the programmable logic resources and programmable routing resources using a second subset of the configuration memory cells;
    a single event upset (SEU) detector coupled to the configuration memory cells for detecting upsets of the configuration memory cells and, in response to detecting an upset of a configuration memory cell, outputting an address of the upset configuration memory cell;
    a discernment circuit coupled to SEU detector and configured to determine from the address of the upset configuration memory cell which one of the first and second copies of the redundant circuit is implemented with the configuration memory cell detected to have been upset:
    wherein the discernment circuit provides a selection signal indicative of the copy of the redundant circuit not implemented with the configuration memory cell detected to have been upset; and
    a selection circuit coupled to the discernment circuit, the selection circuit, in response to the selection signal, selecting an output from the one of the first and second copies of the redundant circuit not implemented with the configuration memory cell detected to have been upset.

16. The system of claim 15, wherein the discernment circuit is configured to determine which of the first and second copies of the redundant circuit is implemented with the configuration memory cell detected to have been upset, from a memory map of redundant circuits to configuration memory addresses stored in a memory unit.

17. The system of claim 16, wherein the memory unit comprises non-volatile memory.

18. The system of claim 16, wherein the memory unit comprises an external memory.

19. An article of manufacture, comprising:
a processor-readable storage medium configured with processor-executable instructions causing one or more processors to process a circuit design, the instructions when executed by a processor causing the processor to perform operations including:
programming configuration memory cells of the programmable logic to implement first and second copies of the circuit; and
in response to detecting a single event upset of one of the configuration memory cells:
determining an address of the one of the configuration memory cells;
determining in which of the first and second copies of the circuit the single event upset occurred from the address of the one of the configuration memory cells; and
selecting an output from the one of the first and second copies of the circuit in which the single event upset did not occur; and
outputting the selected output.

20. The article of manufacture 19, wherein:
the instructions further cause the processor to perform operations including: comparing output from the first and second copies of the circuit; and
the selecting of the output includes selecting an output from the one of the first and second copies of the circuit in response to detecting a single event upset of one of the configuration memory cells and a discrepancy in the compared output.

\* \* \* \* \*